United States Patent [19]

Weber et al.

[11] Patent Number: 4,757,253

[45] Date of Patent: Jul. 12, 1988

[54] CIRCUIT ARRANGEMENT FOR FREQUENCY ANALYSIS OF RECEIVED SIGNALS WHICH LIE IN A WIDE OVERALL FREQUENCY BAND

[75] Inventors: August Weber, Unterpfaffenhofen; Erich Mayerhofer, Taufkirchen; Klaus Weis, Neuried; Guenter Beyer, Geisenbrunn, all of Fed. Rep. of Germany

[73] Assignee: Siemens Aktiengesellschaft, Berlin & Munich, Fed. Rep. of Germany

[21] Appl. No.: 854,403

[22] Filed: Nov. 17, 1977

[30] Foreign Application Priority Data

Nov. 30, 1976 [DE] Fed. Rep. of Germany ....... 2654134

[51] Int. Cl.$^4$ ..................... G01R 23/16; G01R 27/02
[52] U.S. Cl. .................................. 324/77 E; 324/77 B
[58] Field of Search ................. 324/77 B, 77 D, 77 E, 324/77 H; 343/5 SA

[56] References Cited

U.S. PATENT DOCUMENTS 3,418,574 12/1968 Wyckoff ........................... 324/77 E

OTHER PUBLICATIONS

A. Galvin, A Sequential Detection System for the Processing of Radar Returns, Proceedings of IRE, vol. 49, 1961, No. 9, pp. 1417–1423.

*Primary Examiner*—Theodore M. Blum
*Attorney, Agent, or Firm*—Hill, Van Santen, Steadman & Simpson

[57] ABSTRACT

A circuit arrangement for a frequency-dependent analysis of received signals which lie in a wide overall frequency band utilizes a filter bank which cooperates with an evaluation circuit. The filter bank has frequency-dependent band filters connected thereto and comprises an evaluation frequency range which exhibits only a few small band width in relation to the overall frequency band. The received signals are processed by means of a filter circuit having adjoining pass ranges, the signals being modulated by a number of frequency modulators into an evaluation frequency range and an addition of the individual heterodyning frequency values is performed. The frequency-dependent successive partial frequency bands of the received signals, after conversion in the filter circuit, are respectively connected to another of two transmission channels in such a manner that the first transmission channel only transmits the even numbered partial frequency bands in the frequency-dependent succession, and the second transmission channel only transmits the uneven numbered partial frequency bands in the frequency-dependent succession. The transmission channels are coupled to one of two respective equally structured filter banks and all outputs of the filter circuit, engaged by means of received signals, supply the output signal which characterizes engagement. Each received signal, if it falls in only one pass range, passes only one overlapping-free transmission path; if it falls into two adjoining pass ranges, it passes two overlapping-free transmission paths and thereby results in unequivocal frequency values for evaluation.

5 Claims, 7 Drawing Sheets

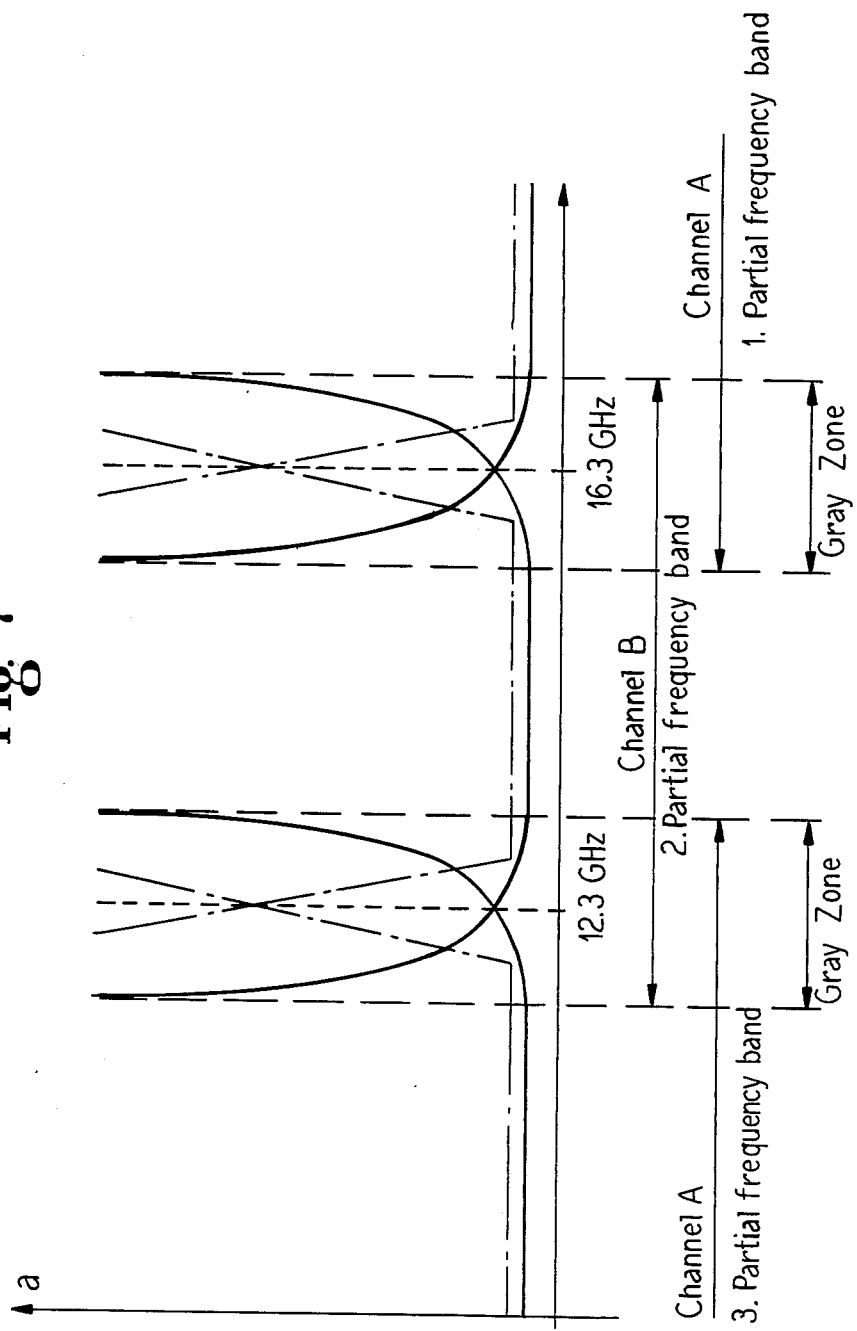

CIRCUIT ARRANGEMENT FOR FREQUENCY ANALYSIS OF RECEIVED SIGNALS WHICH LIE IN A WIDE OVERALL FREQUENCY BAND

BACKGROUND OF THE INVENTION

1. Field of the Invention

This invention relates to a circuit arrangement for the frequency-dependent analysis of received signals which lie in a wide overall frequency band utilizing a filter bank which cooperates with an evaluation circuit, and more particularly to such an arrangement in which the filter bank has frequency-dependent band pass filters and comprises an evaluation frequency range which exhibits only a few small bandwidth in relation to the overall frequency band, and wherein the received signals are processed by a filter circuit having adjoining pass ranges so that the receiving signals are modulated into the evaluation frequency range by means of a number of frequency modulators, and wherein the individual heterodyning frequency values are added.

2. Description of the Prior Art

A radar apparatus is known from the publication "Proceedings of the IRE", Vol. 49, 1961, No. 9, pp. 1417–1423, in which a frequency analysis is undertaken in order to determine the Doppler frequency. The appertaining circuit arrangement operates with a first filter bank, roughly subdividing the practicable frequency range and consisting of a number of band pass filters connected in parallel. On the basis of the rough information thus obtained, that oscillator is then selected from a number of oscillators, by means of a corresponding selection circuit, which permits bringing the received signal into the pass range of a second filter bank which comprises a number of very narrow-banded band pass filters. As a certain time passes for the first frequency analysis in the first filter bank, roughly subdivided, the received signal, in particular the reflected echo pulse, is stored for such a time until the necessary preliminary decisions are made, i.e. the selection of the respective low frequency oscillator. Not until then is a received signal passed on to the finely subdivided second filter bank for a further evaluation.

This known circuit arrangement has the disadvantage that its construction is very expensive. Moreover, it is then no longer suited if a very wide frequency band is to be monitored or is to be examined for the presence of signals.

A difficulty generally occurring in known circuit arrangements which serve for a frequency-dependent analysis of received signals resides in the fact that signals which fall into the transition range, e.g. a "gray range", between two successive pass ranges are either lost in the evaluation due to diminished sensitivity, or provide indication errors. This cannot be completely prevented, no matter how steep the filter response flanks, whereby the disadvantage exists that such filters are complicated and expensive.

SUMMARY OF THE INVENTION

The object of the present invention is to improve a circuit arrangement of the type initially mentioned, with the least possible expense in regard to filter properties, in such a manner that the analysis of very wide frequency bands is possible, and where the difficulties which result between the pass ranges of the individual partial frequency bands by means of the "gray ranges" are also avoided.

The above object is achieved in that the frequency-dependent sequential partial frequency bands in the filter circuit are respectively conveyed to a second or two transmission channels in such a manner that the first transmission channel transmits only the even numbered partial frequency bands in the frequency-dependent succession, and the second transmission channel only transmits the uneven numbered partial frequency bands. The transmission channels are respectively conveyed to one of two equally constructed filter banks (filter bank A, filter bank B in FIG. 4) and all outputs of the filter circuit, busy with received signals, provide an output signal for the evaluation characterizing the engagement thereof by the received signal. Each received signal, if it falls in only one pass range, passes only one overlapping-free transmission path; however, if it falls into adjoining pass ranges, it passes two overlapping-free transmission paths and thereby results in unequivocal frequency values when evaluated.

In this manner it is safeguarded that an unequivocal statement concerning the magnitude of the received frequency is obtained for received signals lying in "gray ranges", and that the sensitivity is also retained. The expense for the filter circuits can be maintained relatively low in that no expensive filters having steep characteristics are required.

In accordance with an advantageous development of the invention, the filters are structured such that the individual adjacent pass ranges overlap one another in regard to their transmission loss in such a manner that the received signals lying in the "gray range" and falling into pass ranges are attenuated as little as possible.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 7 is a graphic illustration which exemplifies the pass ranges of a filter.

DESCRIPTION OF THE PREFERRED EMBODIMENTS

Figure 1:
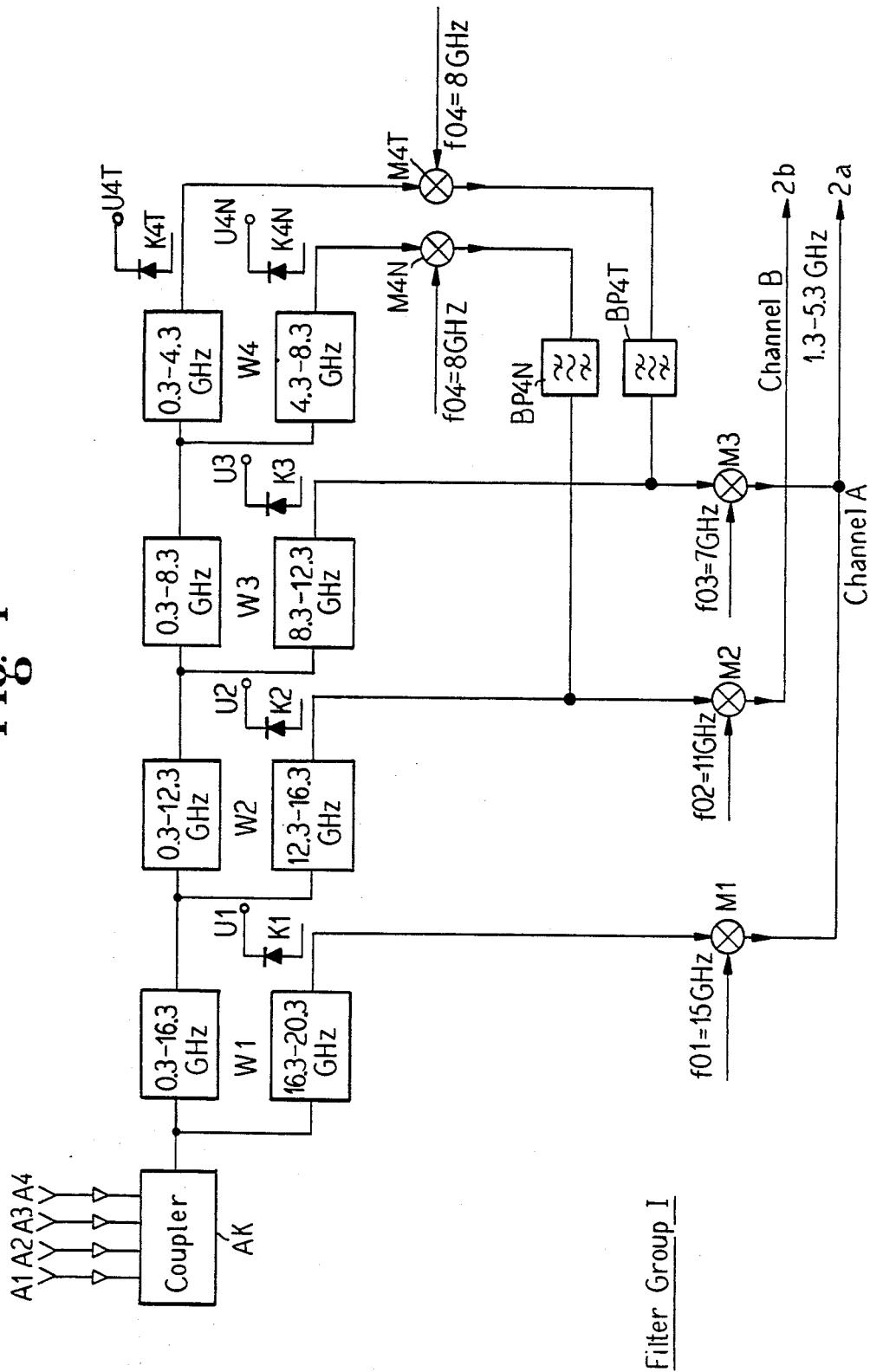
FIG. 1 is a schematic illustration of an input filter group I.

FIG. 1 illustrates the first filter group which is located at the input side of the apparatus and which is collectively referenced as the filter group I. Several antennae A1–A4 are provided for receiving signals to be analyzed, the antennae being connected to the filter group I by way of a coupler AK. This antennae arrangement is necessary because a single antenna is not sufficient for the operation in correspondingly wide receiving frequency bands. In the present exemplary embodiment it is assumed that the receiving frequency range to be analyzed lies between 0.3 and 20.3 GHz. A first filter circuit W1 is connected at the output of the antennae coupler AK, the first filter circuit dividing the receiving frequency range into two frequency bands. The frequencies between 0.3 and 16.3 KHz are fed to a filter circuit W2 which is connected to the output of the filter circuit W1 as a residual frequency band for additional analysis. A specific first partial frequency band, having a width of 4 GHz in the present example, is taken from the second output of the filter circuit W1 so that frequencies between 16.3 and 20.3 GHz may be obtained. The respective limiting values of this and all subsequent partial frequency bands include larger "gray zones", and is explained later on in connection with FIG. 7, which zones are provided by means of the overlapping of the pass ranges of the filters. An output voltage U1 is tapped from the filter circuit and corresponds with the voltage value in the first partial frequency band of 16.3 through 20.3 GHz, which voltage is fed to a mixer M1. A frequency $f01=15$ GHz is fed to the mixer M1 so that the intermediate frequency band obtained therefrom lies between 1.3 and 5.3 GHz in the frequency range. The first intermediate frequency band is fed to a transmission line referenced channel A.

The filter circuit W2 branches off a second partial frequency band which lies between 12.3 and 16.3 GHz, from the frequency band of 0.3 through 16.3 GHz which is applied to the input of the filter circuit W2. An output voltage U2 is obtained from the second partial frequency band by means of a coupler K2. These signals are fed to a mixer M2 which has an heterodyning frequency selected as $f02=11$ GHz. The output signals thus obtained and lying in the joint intermediate frequency band of 1.3 through 5.3 GHz reach a second transmission line referenced channel B. The residual frequency band between 0.3 and 12.3 GHz which is available at the upper output of the filter circuit W2 is fed to a subsequent filter circuit W3.

The filter circuit W3 separates a residual frequency band of 0.3 through 8.3 GHz and supplies the frequency range of 8.3 through 12.3 GHz as a third partial frequency band. The signals in the latter band are fed to a mixer M3 having an heterodyning frequency selected at $f03=7$ GHz. The intermediate frequency band lying between 1.3 and 5.3 GHz is fed to the channel A.

The signals of the upper output of the filter circuit W3 are fed to a following filter circuit W4. The filter circuit W4 supplies the fourth partial frequency band between 4.3 and 8.3 GHz at its lower output, and forms a voltage U4N by means of a coupler K4N. One could obtain a conversion into the intermediate frequency band of 1.3 through 5.3 GHz, required for the channels A and B, by a correspondingly low heterodyning frequency of 3 GHz; however, it is more expedient to undertake the conversion in such a manner that one can operate with relatively high heterodyning frequencies. For this reason, and in order to avoid undesirable mixing products, the heterodyning frequency of a mixer M4N, connected to the output of the filter circuit W4, is selected at the frequency $f04=8$ GHz. The sum frequency of the signals is filtered out by a band pass filter BP4N and the signals thus obtained are fed to the mixer M2. The output signals of the mixer M2 also lie in the intermediate frequency band of 1.3 through 5.3 GHz.

These signals are fed to the channel B. The "resulting heterodyning frequency" from the individual heterodyning frequencies f04 and f02 thus amounts to 3 GHz because the partial frequency band of 4.3 through 8.3 GHz is modulated at 1.3–5.3 GHz in the end result.

The upper output of the filter circuit W4 supplies a residual frequency band between 0.3 and 4.3 GHz and thus simultaneously represents a fifth partial frequency band. An output voltage U4T is obtained by way of a coupler K4T, and after conversion output signals having an heterodyning frequency range $f04=8$ GHz are obtained from the mixer M4T, these signals having the upper side band filtered out by means of a band pass filter BP4T. These signals are additionally fed to the mixer M3 so that output signals result which also lie between 1.3 and 5.3 GHz and these output signals are fed to the channel A. Double conversion is used to avoid undesirable mixing products. The resulting heterodyning frequency amounts to 1 GHz, wherein the sum frequency—in contrast to the preceding conversions—and not the differential frequency, is fed to the channels A and B.

It should be pointed out that the filter circuits provided at the outputs of the mixers M1, M2 and M3 prevent the transmission of the sum frequencies resulting from mixing, are not illustrated in FIG. 1, nor in subsequent drawings. The connecting points, respectively marked as heavy dots, are to indicate that noninteracting split connections are to be provided at these points, for example, circulators or hybrid circuits, which prevent a reciprocal influencing of the signals which are coupled in. If the different frequency values are to be simultaneously present in the evaluation circuits, delay devices must be provided, in the well known manner, which compensate for the different processing times which have occurred, for example, between the first and the last partial frequency band after their respective conversions into the common first intermediate frequency band (i.e. into the channels A and B).

If the frequency bands of the antennae A1–A4 fit into the frequency schedule of the filter circuits, the antennae can also be connected directly to the respective filter circuit. If, for example, the antenna A4 has a receiving frequency range of 0.3 through 8.3 GHz, its output signals can be fed directly into the input of the filter circuit W4.

Viewing the circuit arrangement in accordance with FIG. 1 results, in summary, that from the receiving frequency range of 0.3 through 20.3 GHz receives by the antennae A1–A4, respectively, subsequent partial frequency bands of 4 MHz are filtered out and are brought into a single common intermediate frequency band of 1.3 through 5.3 GHz by means of conversion. The intermediate frequency band of 1.3 through 5.3 GHz, respectively obtained from the frequency-dependent successive arrangement of the partial frequency bands is distributed to the channels A and B in such a manner that the channel A obtains the signals of the intermediate frequency band formed from the partial frequency bands in uneven-numbered sequence, and that the channel B obtains the signals of the intermediate frequency bands formed from the partial frequency bands in even-numbered sequence. The first partial frequency band (16.3–20.3 GHz), the third partial frequency band (8.3–12.3 GHz) and the fifth partial frequency band (0.3–4.3 GHz) are fed to the channel A, whereas the channel B obtains the second partial frequency band (12.3–16.3 GHz) and the fourth partial frequency band (4.3–8.3 GHz). Therefore, the received frequencies are transmitted in the channel A, which originally were between 16.3 and 20.3 GHz, between 8.3 and 12.3 GHz, and between 0.3 and 4.3 GHz. In contrast thereto, the channel B contains the original received frequencies of between 12.3 and 16.3 GHz, and between 4.3 and 8.3 GHz. However, the use of the common intermediate frequency band in the channels A and B, there cannot be a differentiation as to which original frequency range the signals may have been received. This differentiation, i.e. the indication, which partial frequency band has supplied the respective output signals, is obtained by the output voltage U1, U2, U3, U4N and U4T which are called upon, in a manner to be described later on, for evaluation as additional information. The division into individual partial frequency bands can proceed at random per se, whereby the view points of undesired products of mixing and the relative bandwidths (for filter evaluation) are to be taken into consideration.

The attenuation of the pass ranges, in dependence upon frequency, is plotted in FIG. 7. The numerical values, which occur in the filters W1 and W2 in FIG. 1, are referred to in detail. The first partial frequency band extending from 16.3 through 20.3 GHz is fed to the channel A. The second partial frequency band between 16.3 and 12.3 GHz is fed to the channel B, and the third partial frequency band lying between 8.3 and 12.3 GHz is again fed to the channel A. If the filter circuits W1 through Wn of the various figures are not expensively constructed, relatively flat ascents in the area of the filter response flanks result. This is illustrated in FIG. 7 by means of the drawn lines. According to this illustration, greater overlappings occur in the area of the limiting frequencies in the different partial frequency bands. These "gray zones" are made noticeable by the overlapping arrows in FIG. 7.

It is indeed possible, by means of the dash-dot lines, to reduce these gray zones by means of a greater filter expense. However, it is not possible to remove the gray zones completely. Moreover, considerable disadvantages result in that with steeper attenuation curves at the flanks of the filter characteristic, the total circuit arrangement becomes very insensitive in the transition range, for example, at 16.3 GHz. A relatively weak signal of 16.3 GHz is very heavily attenuated by the filters corresponding to the dash-dot lines and is therefore, perhaps not admitted and is thus lost for further evaluation. The overall circuit in this range is very insensitive. The filters corresponding to the solid lines, on the other hand, hardly attenuate the signals even in the range of 16.3 GHz and thus bring about an essentially more advantageous sensitivity of the overall arrangement. Accordingly, the various filter circuits in the range of the limit frequencies between the individual partial frequency bands are constructed such that their attenuation a has not yet risen about a tolerable value. Allowances can readily be made for the gray zones which occur because a differentiation is obtained in that one time the signal is fed to the channel A and the next time the signal may be fed to the channel B. When a signal is received at the frequency of 16.3 GHz, indeed not only the first partial frequency band, but also the second partial frequency band, is engaged. In a further evaluation, as described later on, a double indication of the same frequency value in the end result is obtained if the received signal lies in the gray range.

Figure 2:
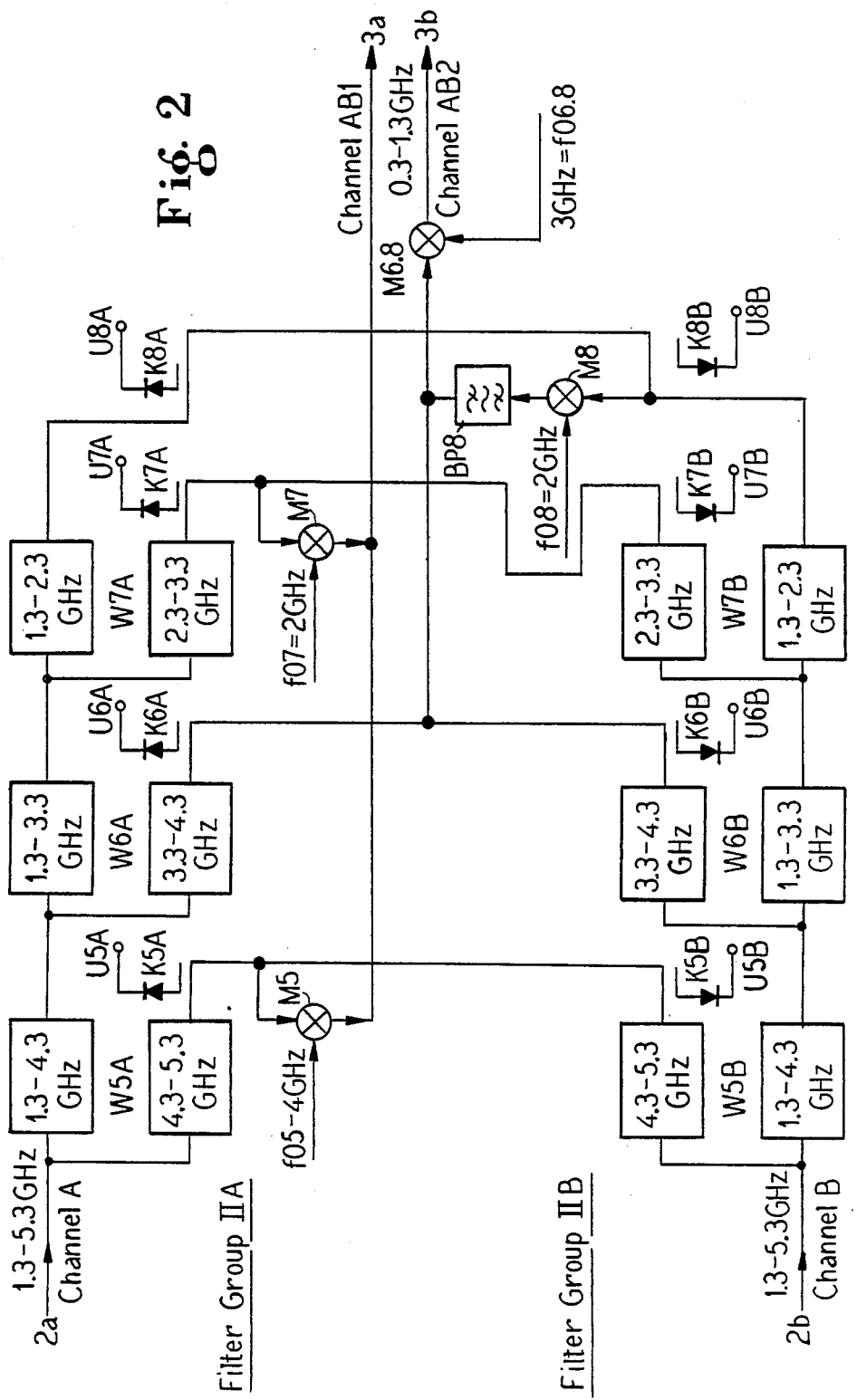
FIG. 2 is a schematic illustration of a pair of subsequent filter groups IIA and IIB.

The output signals of the channels A and B are fed to additional filter groups, as exemplified in FIG. 1, these filter groups being more precisely illustrated in FIG. 2. The channel A is fed to a filter group IIA by way of a terminal 2a. Thus, the frequency range to be processed lies between 1.3 and 5.3 GHz. As in FIG. 1, there is a branching of additional, frequency-dependent narrow partial frequency bands by way of a plurality of filter circuits W5A–W7A which are connected in a chain. The width of the new partial frequency bands in this circuit is only selected at 1 GHz so that the frequencies between 4.3 and 5.3 GHz are present at the lower output of the filter circuit W5A (first partial frequency band of the filter group IIA). An output voltage U5A is produced by way of a coupler K5A. The signals thus obtained are fed to a mixer M5 which has an heterodyning frequency selected at f05=4 GHz. Thereby, signals are obtained whose differential frequency lies between 0.3 and 1.3 GHz (the second intermediate frequency band). These signals are fed to a channel AB1.

The following filter circuit W6A branches off the second partial frequency band between 3.3 and 4.3 GHz in its lower section and produces an output voltage U6A by way of a coupler K6A. The signal thus obtained is fed to a modulator M6, 8 which has an heterodyning frequency selected at f06, 8=3 GHz. Thus, also, frequencies of 0.3 through 1.3 GHz are obtained as difference frequencies, i.e. in the second intermediate frequency band.

The third partial frequency band is coupled out between 2.3 and 3.3 GHz by means of the filter circuit W7A, whereby an output voltage U7A is obtained by way of a coupler K7A. The conversion into the second intermediate frequency band 0.3 through 1.3 GHz is undertaken by a mixer M7 whose heterodyning frequency is selected at f07=2 GHz. The resulting signal is then fed to the channel AB1.

An output voltage U8A is obtained from the fourth partial frequency band between 1.3 and 2.3 GHz by way of a coupler K8A. These signals reach a mixer M8 which has an heterodyning frequency f08=2 GHz. Only the sum frequency is permitted to pass through the band pass filter BP8 so that frequencies between 3.3 and 4.3 GHz are fed to the mixer M6, 8 mentioned above. By means of the additional conversion, which is undertaken in the mixer M6, 8, again values between 0.3 and 1.3 GHz are formed in the second intermediate frequency band and are fed to a channel AB2. Thus, the resulting heterodyning frequency amounts to 1 GHz for the fourth partial frequency band.

Therefore, the circuit proceeds in an analogous manner to the circuit illustrated in FIG. 1 such that the partial frequency bands (respectively 1 MHz wide) of the filter group IIA are alternately fed to the channel AB1 (uneven-numbered partial frequency bands) and to the channel AB2 (even-numbered partial frequency bands). The frequency ranges of 4.3–5.3 GHz and 2.3–3.3 GHz from the channel A of the first intermediate frequency band are contained in the channel AB1. However, the frequency ranges of 3.3–4.3 GHz and of 1.3–2.3 GHz reach the channel AB2.

A filter group IIB, illustrated in the lower part of FIG. 2, is constructed in the same manner as the filter group IIA. The individual filter circuits W5B, W6B and W7B have the same frequency ranges as in the filter group IIA, as is illustrated from the frequency values provided in the respective filter block symbols of the drawing. The connecting to the two channels AB1 and AB2 results in the same manner as in the filter group IIA. This means that the uneven-numbered partial frequency bands of between 4.3 and 5.3 GHz and between 2.3 and 3.3 GHz coming from the channel B are contained in the channel AB1, whereas the even numbered partial frequency bands of between 3.3 and 4.3 GHz and between 1.3 and 2.3 GHz coming from the channel B are fed to the channel AB2.

The mixers M5, M7, M8, M6, 8, already mentioned in the filter group IIA, are also utilized for conversion, which is readily possible due to the same partial frequency bands in the filter groups IIA and IIB, and the same second intermediate frequency band of 0.3 through 1.3 GHz, and provides the same heterodyning frequencies. The respective output voltages are referenced U5B-U8B for the filter group IIB.

Figure 3:
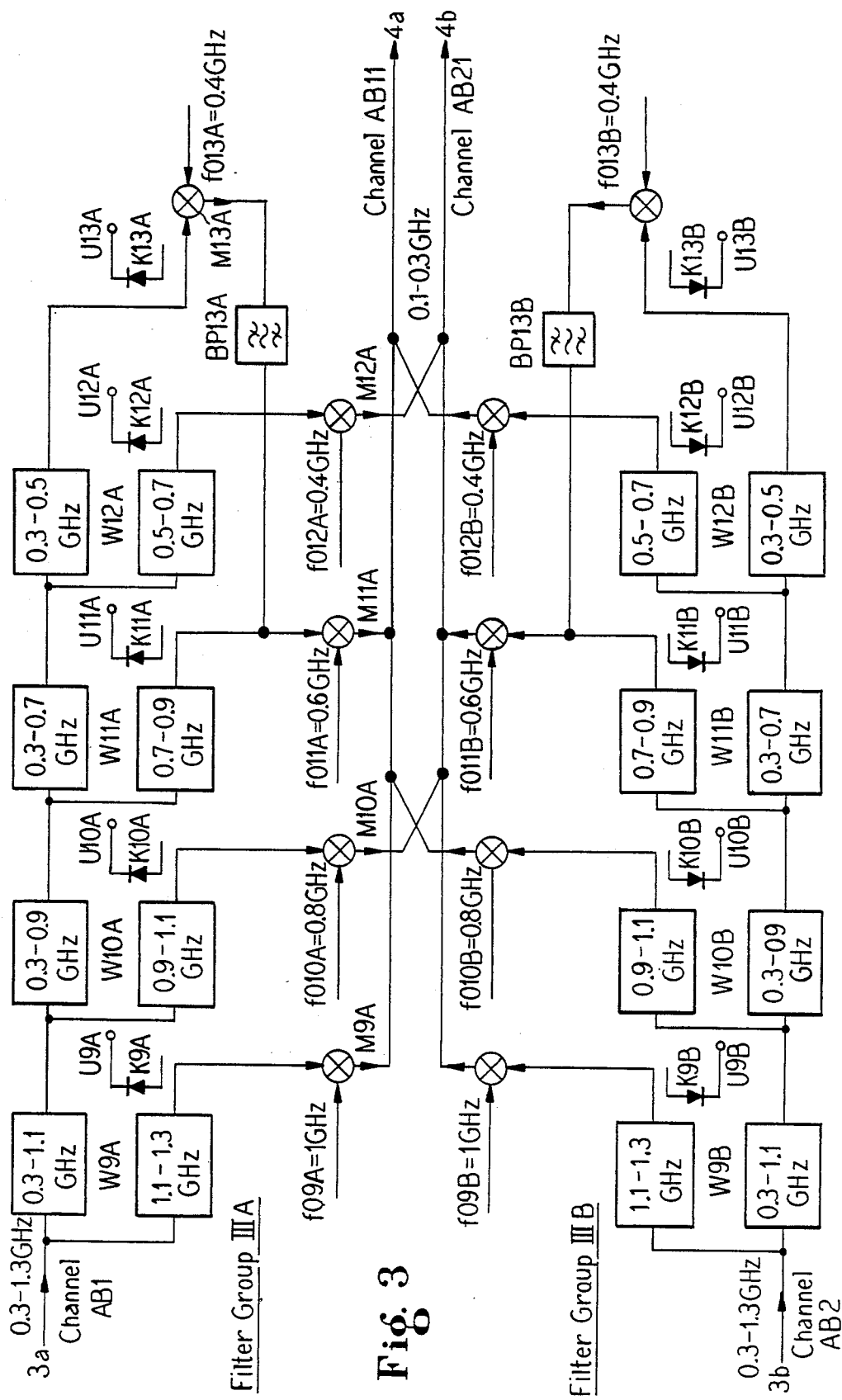
FIG. 3 is a schematic illustration of a pair of subsequent filter groups IIIA and IIIB, in accordance with FIG. 2.

A circuit constructed in accordance with FIG. 3 is connected to the output terminals 3a, 3b of FIG. 2 and contains two filter groups IIIA and IIIB. The upper filter group IIIA has a chain-connected arrangement of filter circuits W9A-W12A, whereby the partial frequency bands of only 0.2 GHz are coupled out. The distribution of the new partial frequency bands to the filter circuits is selected in the same manner as previously discussed with respect to FIGS. 1 and 2. More specifically, the filter circuit W9A couples out the partial frequency band between 1.1 and 1.3 GHz. The coupled-out frequency band lies between 0.9 and 1.1 GHz in the filter circuit W10A, between 0.7 and 0.9 GHz in the filter circuit W11A, and between 0.5 and 0.7 GHz in the filter circuit W12A, and the last partial frequency band comprises frequencies between 0.3 and 0.5 GHz. The output voltages occurring at the outputs of the filter circuits are branched off by corresponding couplers K9A-K13A and are referenced U9A-U13A, respectively. The received signals reach a plurality of mixers M9A-M12A, whose heterodyning frequencies f09-f012 are respectively selected to have a difference of 0.2 GHz. First of all, there is an upward modulation with the frequency f013A=0.4 GHz in the mixer M13A, and thus the sum frequency (after filtering by a band pass filter BP13A) is converted into the differential frequency in the mixer M11A, this frequency being in the range of 0.1 and 0.3 GHz. Therefore, the resulting heterodyning frequency for the fifth partial frequency band is at 0.2 GHz. A third intermediate frequency band lying between 0.1 to 0.3 GHz occurs at the outputs of these mixers. The sequence of the distribution of the individual partial frequency bands of 0.2 GHz band width each results such that the uneven-numbered partial frequency bands (first partial frequency band of 0.1-0.3 GHz; the third frequency band of 0.7-0.9 GHz; and the fifth partial frequency band of 0.3-0.5 GHz) in sequence are fed to a channel AB11. The even numbered partial frequency bands (second partial frequency band of 0.9-1.1 GHz; and the fourth partial frequency band of 0.5-0.7 GHz) in the sequence are, however, fed to a channel AB21. Therefore, the receiving frequencies lies only in the third intermediate frequency band, i.e. between 0.1 and 0.3 GHz at the outputs 4a and 4b of the two channels AB11 and AB21, respectively.

In the lower portion of FIG. 3 an additional filter group IIIB is illustrated. The structure of the filter group IIIB, which has filter circuits W9B-W12B, is the same as that of the filter group IIIA, and also the respectively processed frequencies (the partial frequency bands and residual frequencies and third intermediate frequency band) result in the same values as in the filter group IIIA. Accordingly, the respective frequencies for the heterodyning frequencies in the modulators M9B-M13B are also completely equal to the respectively analogous referenced mixers M9A-M13A of the filter group IIIA. The distribution of the respective output voltages in the individual partial frequency bands is determined by a plurality of couplers K9B-K13B, in the same manner as mentioned above, to supply the respective voltages U9B-U13B.

A difference in relation to the filter group IIIA exists in the filter group IIIB in that the uneven numbered partial frequency bands (the first partial frequency band of 1.1-1.3 GHz; the third partial frequency band of 0.7-0.9 GHz; and the fifth partial frequency band of 0.3-0.5 GHz) are fed to the channel AB21, whereas the even-numbered partial frequency bands (the second partial frequency band of 0.9-1.1 GHz; and the fourth partial frequency band of 0.5-0.7 GHz) are fed to the channel AB11.

Figure 4:
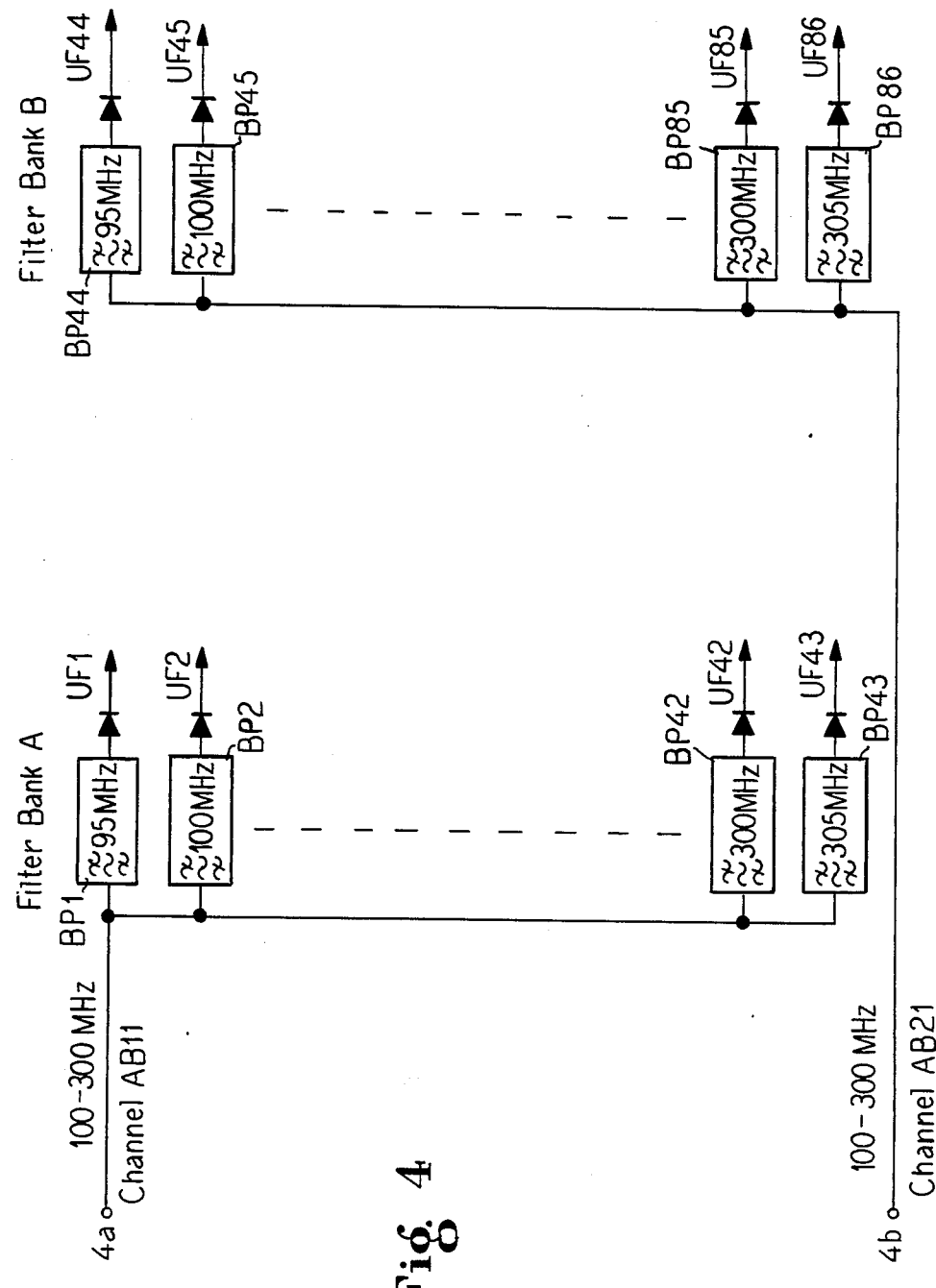
FIG. 4 is a schematic illustration of two equally constructed filter banks A and B which follow the structure of FIG. 3.

FIG. 4 illustrates circuits for the additional evaluation of the signals of the channels AB11 and AB21 supplied by the circuit of FIG. 3. The channel AB11 having a bandwidth of 100 through 300 MHz is fed in at the terminal 4a. The analysis of this frequency range of 200 MHz bandwidth results in a filter bank A comprising 43 parallel-connected band pass filters BP1-BP43. Each of these band pass filters has a pass band of 10 MHz, the respective center frequency being provided in the corresponding symbolic filter block. The band pass filter BP1 therefore has a pass band of 90-100 MHz. The band pass filter 43, provided for the highest frequencies, has a pass band of 300-310 MHz. The output voltages for the respective filters, after rectification, are referenced UF1-UF43. The fact that the band pass filter BP1 and the band pass filter BP43 actually extend outside of the third intermediate frequency band is based on the fact that even in the border or limiting frequency ranges signal portions can occur by means of the modulation of the received signals.

The channel AB21 is connected to a filter bank B by way of the terminal 4b. The filter bank B is constructed the same as the filter bank A. Therefore, 43 band pass filters are also provided, which filters are referenced BP44-BP86, each of these filters again having a pass band of 10 MHz. The rectified output voltages of the filters are referenced UF44-UF86 in the filter bank B.

The object now is to determine, by means of a corresponding logical linkage of the output voltages U1-U13B obtained from the individual partial frequency bands in the respective filter groups and with the aid of the output voltages UF1-UF86 of the filter banks A and B of FIG. 4, in which frequency band a received signal was originally located. An additional objective is to unequivocally determine the frequency position of signals whose frequency falls into one of the gray zones of the filter groups. The evaluation circuits of FIG. 5 and FIG. 6, which are to adjoin each other with FIG. 6 to the right of FIG. 5, are provided for this purpose.

The different output voltages U1-U13B of FIGS. 1-3 are fed to memories, in particular read only memories, hereinafter referred to, at least partially, by the designation ROM. The respective output voltages either have the value of "0" (i.e. no output signal is present) or the value of "1" (i.e. output signal is present). Each logical "1" reads the appertaining frequency number in a read only memory ROM, i.e. reads a combination of bits which contains the frequency value of the respective resulting overlapping frequency in coded form. Thus, that frequency is determined in the resulting heterodyning frequency which corresponds with the difference of the respective frequency band minus the appertaining common intermediate frequency band.

The respective filter groups of FIGS. 1-3 are referenced by the corresponding Roman numerals and supplementarily by the capital letters in the read only memories ROM. In the upper portion of FIG. 5, the output voltages U1, U3 and U4T (the uneven numbered partial frequency bands from FIG. 1) are fed to a read only memory ROM-I-U, where the letter U respectively stands for the uneven numbered partial frequency bands. The even numbered output voltages U5A and U7A of the filter group IIA, according to FIG. 2, are fed to a read only memory ROM-IIA-U. The even-numbered output voltages U6A and U8A of the filter group IIA, according to FIG. 2, are input to a read only memory ROM-IIA-G, where the letter G refers to the even-numbered partial frequency bands. The uneven-numbered partial frequency bands corresponding to the output voltages U9A, U11A and U13A of the filter group IIIA of FIG. 3 are fed to a read only memory ROM-IIIA-U, whereas a read only memory ROM-IIIB-G receives the output voltages U10B and U12B of the even-numbered partial frequency bands of the filter group IIIB in accordance with FIG. 1.

Figure 5:
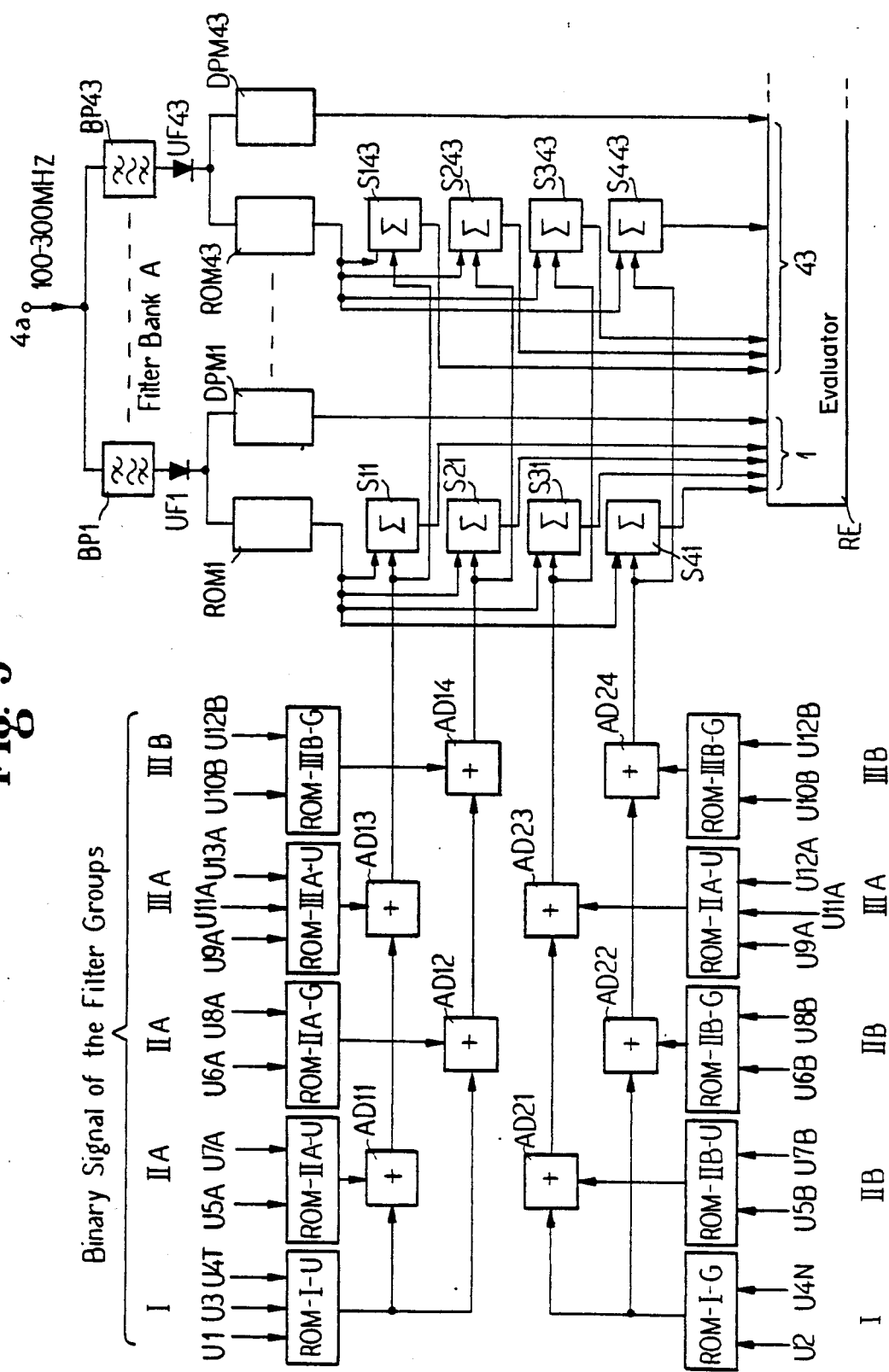
FIG. 5 is a schematic illustration of the logical linkages between the first filter bank A and the preceding filter groups.

The read-only memory ROM-I-G illustrated in the lower portion of FIG. 5 receives, in an analogous manner, the even-numbered output voltages U2 and U4N of the filter group I, a read only memory ROM-IIB-U receives the uneven-numbered output voltages U5B and U7B of the filter group IIB, a read only memory ROM-IIB-G receives the even-numbered output voltages U6B and U8B of the filter group IIB, a read only memory ROM-IIIA-U receives the uneven-numbered output voltages U9A, U11A and U13A of the filter group IIIA, and, finally, a read only memory ROM-IIIB-G receives the even-numbered output voltages U10B and U12B of the filter group IIIB.

The frequency number of the read only memory ROM-I-U is conveyed to two parallel adding stages AD11 and AD12. An additional adding stage AD13 is connected to the output of the adding stage AD11, which also receives the frequency number of the read only memory ROM-IIA-U. The adding stage AD12 is followed by an adding stage AD14 to which the frequency number of the read only memory ROM-IIB-G is fed. The output of the adding stage AD13 is connected, in multiple, with a pair of summation stages S11 and S143 (described in greater detail below), and to which the respectively resulting frequency numbers from the filter groups are fed. The result at the output of the adding stage AD14 is connected, in multiple, to a pair of summation stages S21 and S243.

The frequency number of the read only memory ROM-I-G is fed to a pair of parallel adding stages AD21 and AD22, whereby the adding stage AD21 obtains the frequency number of the read only memory ROM-IIB-U at one of its inputs, and the adding stage AD22 receives the frequency number of the read only memory ROM-IIB-G. The output of the adding stage AD21 is fed to an adding stage AD23 which also obtains the frequency number of the read only memory ROM-IIIA-U. The value thus obtained is fed, in multiple, to a pair of summation stages S31 and S343. The output signal of the adding stage AD22 is applied to an adding stage AD24 which also receives the frequency number of the read only memory ROM-IIIB-G. The frequency number obtained after the addition in the adding stage AD24 is fed, in multiple, to a pair of summation stages S41 and S443.

In the right-hand portion of FIG. 5, the logical linkage of the information obtained from the read only memories is illustrated with the voltage values UF-1-UF43 obtained from the band pass filters BP1-BP43 of the filter bank A, whereby—in order to simplify—only the processing of the first output signal UF1 and the last output signal UF43 is specifically referenced.

The absolute magnitude of the voltage value is determined by each voltage value UF1-UF43 and converted into a digital word, a plurality of analog/digital converters DPM1-DMP43 being provided for that purpose. This level information is fed to evaluator RE, in which the evaluation of the individual information is carried out.

The individual voltage values UF1-UF43, moreover, are respectively fed to a read only memory ROM-1-ROM43 as 1-bit information items (voltage present="1", voltage missing="0").

A logical "1" calls the frequency number, characterizing the respective frequency band, in the appertaining read only memory ROM1-ROM43, this frequency number then being made available at the output. A line of summation devices is connected to the output of each of the read only memories ROM1-ROM43, these summation devices respectively comprising four summation stages S11, S21, S31 and S41 (for the read only memory ROM1) and S143, S243, S343, S443 (for the read only memory ROM43), these stages being connected in multiple to the output of the appertaining read only memory.

The summation stages S11-S443 form an overall frequency number from the two respectively adjacent frequency numbers, this overall frequency number being fed to the computer RE. This overall frequency number indicates the frequency value of the respectively received signal. In order to obtain unequivocal results, the adding stages AD11-AD24, and the summation stages S11-S443 must be constructed such that they only provide sum output signals when the two inputs are simultaneously engaged, or are engaged within a specific time (dependent upon processing time). Thus, only that line of the summation matrix, corresponding with the respective signal paths, receives a frequency number because only in such a line are three filter groups sequentially engaged. As only one column (only one receiving signal respectively presumed) is engaged by one frequency number, the summation stage Snm which is at the intersection of an engaged line and an engaged column precisely indicates the correct frequency value of the received signal and supplies the overall frequency number to the evaluator RE.

Figure 6:
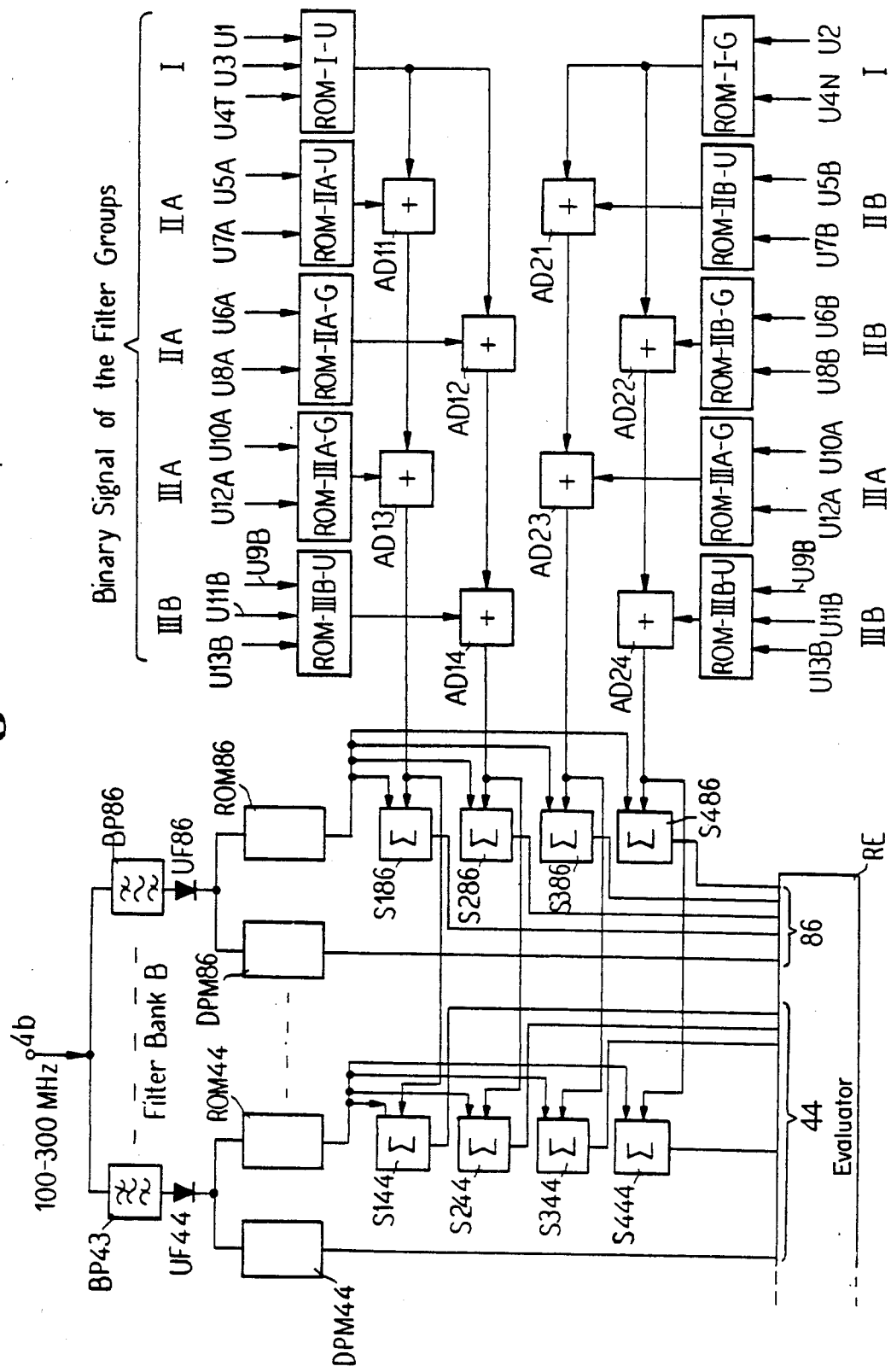
FIG. 6 is a schematic illustration of the logical linkages between the second filter bank B and the preceding filter groups.

FIG. 6 illustrates the logical linkages of the information obtained by the filter bank B with the various output voltages of the individual filter groups. The construction is completely analogous to the embodiment illustrated in FIG. 5. Thus, for the output voltages UF44-UF86 the respective analog/digital converters DPM44-DPM86 are provided which transmit the information to the computer RE by way of the signal amplitudes.

Moreover, by each engaged band pass filter BP43-BP86 the appertaining frequency number is formed in the read only memories ROM44-ROM86 and is transmitted to the summation stages S144–S486. Respectively, four such summation stages are connected in a multiple and arranged as a column.

The read only memories ROM-I-U, ROM-IIA-U, ROM-IIA-G and the read only memories ROM-I-G, ROM-IIB-U and ROM-IIB-G receive the same frequency information as the correspondingly referenced components in FIG. 5. They are connected with the adding stages AD11, AD12, AD21 and AD22 in the same manner as in FIG. 5.

For the remaining read only memories, however, the following distribution of the output voltages result:
ROM-IIIA-G—output voltages U12A, U10A
ROM-IIIB-U—output voltages U13B, U11B, U9B
ROM-IIIA-G—output voltages U12A, U10A
ROM-IIIB-U—output voltages U13B, U11B, U9B The read only memory ROM-IIIA-G is connected to the adding stage AD13 which supplies the resulting frequency number to the summation stages S144 and S186 of the summation matrix. The frequency numbers reach the adding stage AD14 from the read only memory ROM-IIIB-U, and supplies the result to the second line of the summation matrix, that is to the summation stages S244 and S286. The frequency numbers of the read only memory ROM—IIIA-G are applied to an adding stage AD23 from which the resulting frequency number is transmitted to the summation stages S344 and S386, the third line of the summation matrix. The frequency numbers of the read only memory ROM-IIIB-U are applied to the adding stage AD24 which, in turn, supplies the summation stages S444 and S486 of the summation matrix.

In the summation matrix provided for the filter bank B, also, only one single column (with only one received signal) is engaged by one of the read only memories ROM44–ROM86. In the same manner, one resulting frequency number is present in only one single line, this frequency number originating from, respectively, three successive filter groups. Thus, there also, only one single summation stage is actuated twice, and results in one overall frequency number characterizing the frequency of the received signal.

For the explanation of the operating characteristic of the circuit of the present invention, several examples of receiving frequencies are subsequently provided and the appertaining results are illustrated in tabular form.

TABLE I

Unique Reception
(Outside of Gray Range)
Receiving Frequency: 8.4 GHz

| Filter | Voltage | Memory | Resulting Freq.f0r (GHz) | IF (GHz) | Channel |
|---|---|---|---|---|---|
| W3 | U3 | ROM-I-U | 7 | 1.4 | A |
| W7A | U8A | ROM-IIA-G | 1 | 0.4 | AB2 |
| W12B | U13B | ROM-IIIB-U | 0.2 | 0.2 | AB21 |

From the sum of the f0r, the value of 8.2 GHz is the result, in toto. To this value, the frequency value of 0.2 GHz is added from the filter band B in the matrix, in accordance with FIG. 6, so that, in toto 8.2+0.2=8.4 GHz which is the resulting received frequency. The second line of the summation matrix, in accordance with FIG. 6, is activated because at the output of the adding stage AD14, a frequency number (8.2 GHz) occurs which leads to a coincidence in the column corresponding with the band pass filter of 200 MHz, and thus is also engaged, and supplies an overall frequency number of 8.4 GHz to the evaluator RE. In FIG. 5, however, as can easily be determined with the aid of the engagement of the read only memory, no engagement of a line takes place, and thus no indication is provided in the evaluator RE. No column is engaged, in FIG. 5, also because the filter bank A is not activated (i.e. no signal in the channel AB11).

TABLE II

Reception In The Gray Range
Receiving Frequency: 12.3 GHz

| Filter | Voltage | Memory | Resulting Freq.f0r (GHz) | IF (GHz) | Channel |
|---|---|---|---|---|---|
| (a) Path 1 | | | | | |
| W2 | U2 | ROM-I-G | 11 | 1.3 | B |
| W7B | U8B | ROM-IIB-G | 1 | 0.3 | AB2 |
| W12B | U13B | ROM-IIIB-U | 0.2 | 0.1 | AB21 |
| (b) Path 2 | | | | | |
| W3 | U3 | ROM-I-U | 7 | 5.3 | A |
| W5A | U5A | ROM-IIA-U | 4 | 1.3 | AB1 |
| W9A | U9A | ROM-IIIA-U | 1 | 0.3 | AB11 |

For the path 1 in FIG. 6 results an engagement of the fourth line by means of the frequency number of 12.2 GHz at the output of the adding stage AD24. Together with the band pass filter from the filter bank B for 100 MHz center frequency (engagement of one column) results in their overall frequency number of 12.3 GHz in the evaluator RE. By means of the filter bank A (engagement of the band pass filter for 300 MHz) and the engagement of the first line of the summation matrix in accordance with FIG. 5, there also the overall frequency number of 12.3 GHz is formed in the evaluator RE.

It should be pointed out that the number of the successive filter groups primarily depends on the width of the frequency band to be analyzed, and how fine the desired final resolution. The filter circuits illustrated in FIGS. 1–3 can therefore be varied in a multiple manner. In the extreme case, (in accordance with the filter group I of FIG. 1) the filter banks A and B of FIG. 4 can be directly connected to the two transmission channels A and B (however, with a correspondingly altered operational frequency range, namely of 1.3–5.3 GHz). On the other hand, it is also possible to provide additional filter circuits. It is only to be observed that the alternating distribution of the output signals to the transmission channels, and the overlapping-free transmission paths are to be maintained.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a circuit arrangement for analyzing and determining the frequencies of signals received in a wide frequency band, of the type wherein a filter bank is cooperatively connected with an evaluation circuit, the filter bank has a plurality of band pass filters with adjacent pass bands which cover an evaluation frequency range which is very small in relation to the overall frequency band, wherein the received signals are processed by means of a filter circuit having a plurality of adjacent pass bands and a plurality of modulators connected thereto to convert the signals into the evaluation frequency range of the filter bank, and wherein the individual heterodyning frequency values are added in the frequency analysis, the improvement therein comprising:

a pair of transmission channels connected to said modulators such that modulators associated with first alternate frequency bands are connected to one of said channels and the modulators associated with second alternate frequency bands are connected to the other of said channels;

a pair of filter banks connected to respective ones of said transmission channels; and means connected to said filter circuit and to said filter banks and responsive to signals in the respective pass bands to provide respective output signals characterizing the signals in those pass bands, whereby each received signal traverses only one overlapping-free transmission path if it falls in only one pass band and traverses two overlapping-free transmission paths if it falls into two adjoining pass bands to result in unequivocal frequency values indicated by said output signals for evaluation.

2. The improved circuit arrangement of claim 1, wherein said filter circuit comprises a first filter group, and a plurality of pairs of second filter groups, each of said filter groups including an input connected to only one transmission channel, respectively, and an output connected, alternatingly, to two transmission channels, said filter groups thus being connected in a chain with the last filter groups connected to said two filter banks.

3. The improved circuit arrangement of claim 2, comprising a plurality of read only memories each connected to and actuated by selected combinations of said output signals, a read only memory which contains the appertaining resulting heterodyning frequency being activated to provide a frequency indicating number for evaluation, and a plurality of adding circuits connected to said read only memories for adding the frequency numbers emitted by said read only memories.

4. The improved circuit arrangement of claim 3, comprising a summation matrix connected to said adding circuits and including a plurality of summing circuits arranged in columns and rows with the summing circuits of an individual row connected to the same adding circuit, a plurality of additional read only memories each having an output connected, in multiple, to each summing circuit of a column, and having an input connected to receive a respective output signal from said filter banks and responsive thereto to indicate the presence of a frequency being analyzed in the respective pass band, whereby the appertaining frequency number is produced when a signal is engaging the filter bank in the respective pass band, and the summing circuits activated by said adding circuits and said additional read only memories provide the frequency numbers which result from substantially coincident engagement of columns and rows of the matrix.

5. The improved circuit arrangement according to claim 1, wherein said filter circuit and said filter banks comprise individual filters whose adjacent pass bands overlap one another with respect to pass attenuation, in such a manner that received signals which lie in the gray range and fall into two pass bands are attenuated as little as possible in at least one of the appertaining pass bands.

* * * * *